United States Patent
Chen et al.

(10) Patent No.: US 7,446,621 B2
(45) Date of Patent: Nov. 4, 2008

(54) CIRCUIT AND METHOD FOR SWITCHING PFM AND PWM

(75) Inventors: Li Chieh Chen, Hsinchu (TW); Yu Min Sun, Hsinchu (TW); Chu Yu Chu, Hsinchu (TW)

(73) Assignee: Advanced Analog Technology, Inc. (TW)

( * ) Notice: Subject to any disclaimer, the term of this patent is extended or adjusted under 35 U.S.C. 154(b) by 16 days.

(21) Appl. No.: 11/808,085

(22) Filed: Jun. 6, 2007

(65) Prior Publication Data

US 2008/0218284 A1    Sep. 11, 2008

(30) Foreign Application Priority Data

Mar. 7, 2007    (TW) .............. 96107782 A

(51) Int. Cl.
*H03K 7/04* (2006.01)
*H03K 7/06* (2006.01)

(52) U.S. Cl. .................. 332/112; 332/108; 332/109

(58) Field of Classification Search ......... 332/107–109, 332/112–113; 323/282–842
See application file for complete search history.

(56) References Cited

U.S. PATENT DOCUMENTS

| 7,408,333 | B2 * | 8/2008 | Chen et al. ............... 323/282 |
| 2006/0273772 | A1 * | 12/2006 | Groom ............... 323/284 |
| 2008/0022139 | A1 * | 1/2008 | Lin et al. ............... 713/320 |

OTHER PUBLICATIONS

U.S. Appl. No. 11/725,440, filed Mar. 20, 2007 in the name of Chen et al.

* cited by examiner

*Primary Examiner*—Anh Q Tran
(74) *Attorney, Agent, or Firm*—Oliff & Berridge, PLC

(57) ABSTRACT

The switching method between pulse frequency modulation and pulse width modulation signals is first based on an output voltage of a power transistor to generate a corresponding pulse frequency modulation signal. Next, it is determined whether the corresponding pulse frequency modulation signal has reached its maximal frequency. If so, the initial pulse width modulation signal is adjusted to have the same width as the pulse frequency modulation signal. Thereafter, the adjusted pulse width modulation signal is outputted.

11 Claims, 6 Drawing Sheets

CIRCUIT AND METHOD FOR SWITCHING PFM AND PWM

BACKGROUND OF THE INVENTION

1. Field of the Invention

The present invention relates to a circuit and method for switching pulse frequency modulation (PFM) and pulse width modulation (PWM), and more particularly, to a circuit and method for smoothly switching PFM and PWM based on the status of output loading.

2. Description of the Related Art

FIG. 1 shows a prior art control circuit of a power transistor 11, which is used in a photoflash capacitor charger or a backlight controller. For prior applications, usually output loading must be measured first, and thereafter, connecting the gate of the power transistor to either the PFM or PWM will be determined. For PFM signals, the more loading there is, the higher the frequency is. For PWM signals, the more loading there is, the wider the pulse is. Generally speaking, a heavy output loading is suitable to PWM, but a light output loading is suitable to PFM. The prior circuit in FIG. 1 detects current I of the inductor L and power transistor 11 to determine an output loading condition, i.e., the so-called current mode. Therefore, an analog IC which includes the switching circuit between PFM and PWM must incorporate the power transistor 11. The prior method has the disadvantage of a large chip area and the inability to choose the desired power transistor by users themselves, e.g., a power transistor 11 with small impedance, and therefore a lot of inconveniences occur.

Besides, the prior switching method between PFM and PWM usually adopts a skip mode or burst mode. No matter which mode is chosen, the switching process is not entirely smooth, so the output voltage will jitter. If such a prior circuit is used in backlight controlling, the output display quality is not very good.

In short, avoiding the manufacture of a power transistor 11 and a switching circuit in a single IC and smoothly switching between PFM and PWM signals is an important issue right now.

SUMMARY OF THE INVENTION

The switching circuit and method between PWM and PFM signals of the present invention detects if the PFM signal enters or leaves its maximal frequency. When the PFM signal enters its maximal frequency, the initial pulse width of the PWM signals will be adjusted to be the same as the pulse width of the PFM signals. Thereafter, a linear transformation commences in order to avoid jitters.

The circuit for switching PFM and PWM according to an embodiment of the present invention includes an oscillator, an oscillator-controlling unit, a PFM comparison unit, a mode transfer detection unit, a PWM comparison unit, a multiplexer and a logic-controlling unit. The oscillator is for use in generating triangular waves. The oscillator-controlling unit connects to the oscillator to generate PFM signals. The PFM comparison unit connects to the oscillator-controlling unit. The mode transfer detection unit connects to the PFM comparison unit to detect if the PFM signals have reached a maximal frequency. The PWM comparison unit is configured to adjust the initial width of the PWM signals to be equal to the pulse width of the PFM signals when the maximal frequency occurs. The multiplexer is for use in selecting either the PFM or PWM signals. The logic-controlling unit is configured to control the multiplexer according to the result of the mode transfer detection unit.

The method for switching PFM and PWM according to an embodiment of the present invention includes the step of generating PFM signals based on an output voltage of a power transistor. Thereafter, it is determined if the PFM signals have reached a maximal frequency. Next, the initial pulse width of the PWM signals is adjusted to be equal to the pulse width of the PFM signals if the maximal frequency occurs. Finally, the PWM signals are switched to be output signals.

The method for switching PFM and PWM according to an embodiment of the present invention includes the step of determining if the PFM signals have left maximal frequency based on an output voltage of a power transistor. Thereafter, the pulse width of the PWM signals is adjusted to be equal to the pulse width of the PFM signals. Finally, the PFM signals are switched to be output signals.

BRIEF DESCRIPTION OF THE DRAWINGS

The invention will be described according to the appended drawings in which.

PREFERRED EMBODIMENT OF THE PRESENT INVENTION

Figure 1:
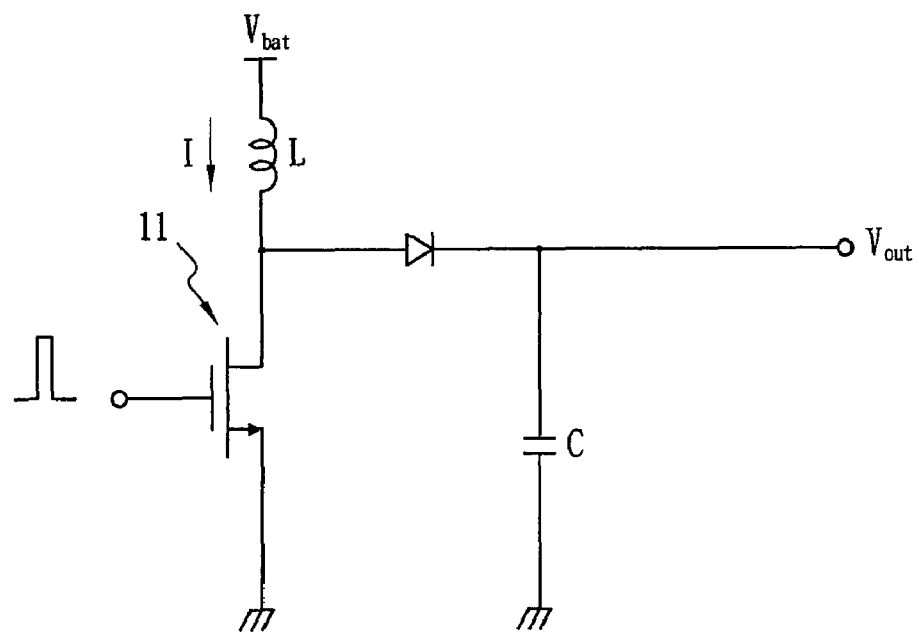
FIG. 1 is a prior art control circuit of a power transistor.
Figure 2:
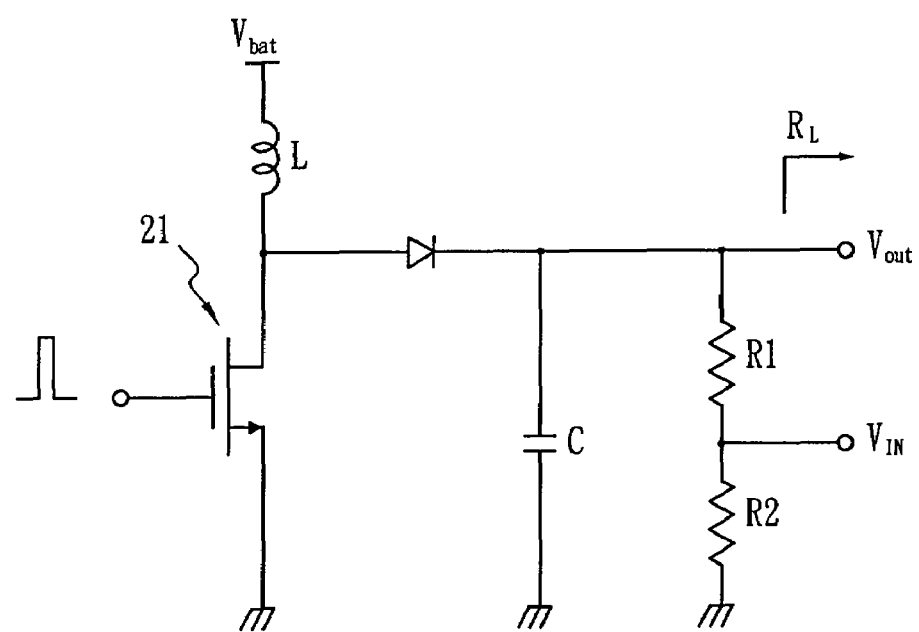
FIG. 2 is a method for switching PFM and PWM according to an embodiment of the present invention.

FIG. 2 is a method for switching PFM and PWM according to an embodiment of the present invention, which captures dividing voltage $V_{IN}$ from output resistors $R_1$ and $R_2$ to determine loading status, i.e., voltage mode. The greater the output loading $R_L$ is, the smaller $V_{IN}$ is. Otherwise, $V_{IN}$ is greater. By means of observing the dividing voltage $V_{IN}$, the present invention can decide whether the output end is in heavy loading or light loading. Further, the present invention decides that the gate of the power transistor 11 should be connected to either PFM or PWM signals based on the above loading status. Because the present invention will not detect current of the power transistor 21, it is not necessary to manufacture the power transistor 21 in a single chip with the switching circuit. Therefore the present invention has a smaller chip area.

Figure 3:
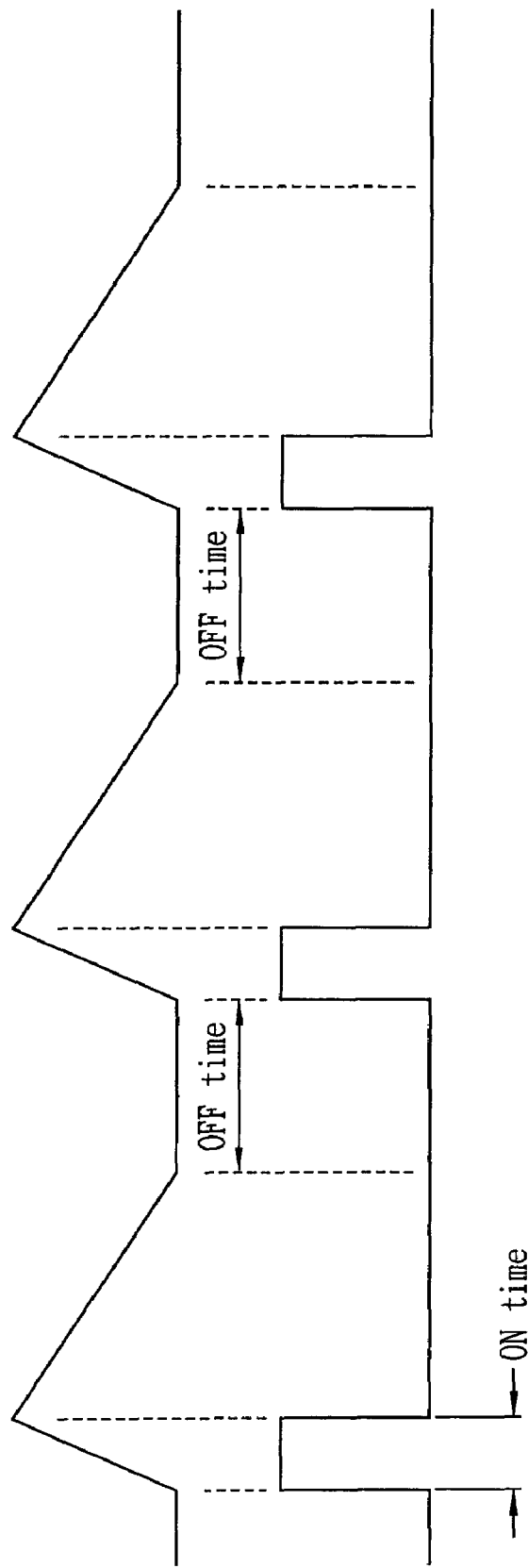
FIG. 3 is a hint diagram of PFM signals of the present invention.

FIG. 3 is a hint diagram of PFM signals of the present invention. In practical applications, the PFM signals generated by an oscillator usually are triangular. When the value of the OFF time is equal to zero or close to zero, it represents the fact that PFM signals have reached the maximal frequency. In the meantime, the PFM signals are in a situation of continuous waveform. For the PFM signals, their pulse width is fixed, i.e., ON-time shown in FIG. 3. But for the PWM signals, their pulse width is not fixed. The present invention detects if the PFM signals have entered their maximal frequency, and if so, adjusts the initial pulse width of the PWM signals to be equal to the pulse width of the PFM signals and performs a linear transformation at that time in order to avoid prior art jitters.

Figure 4:
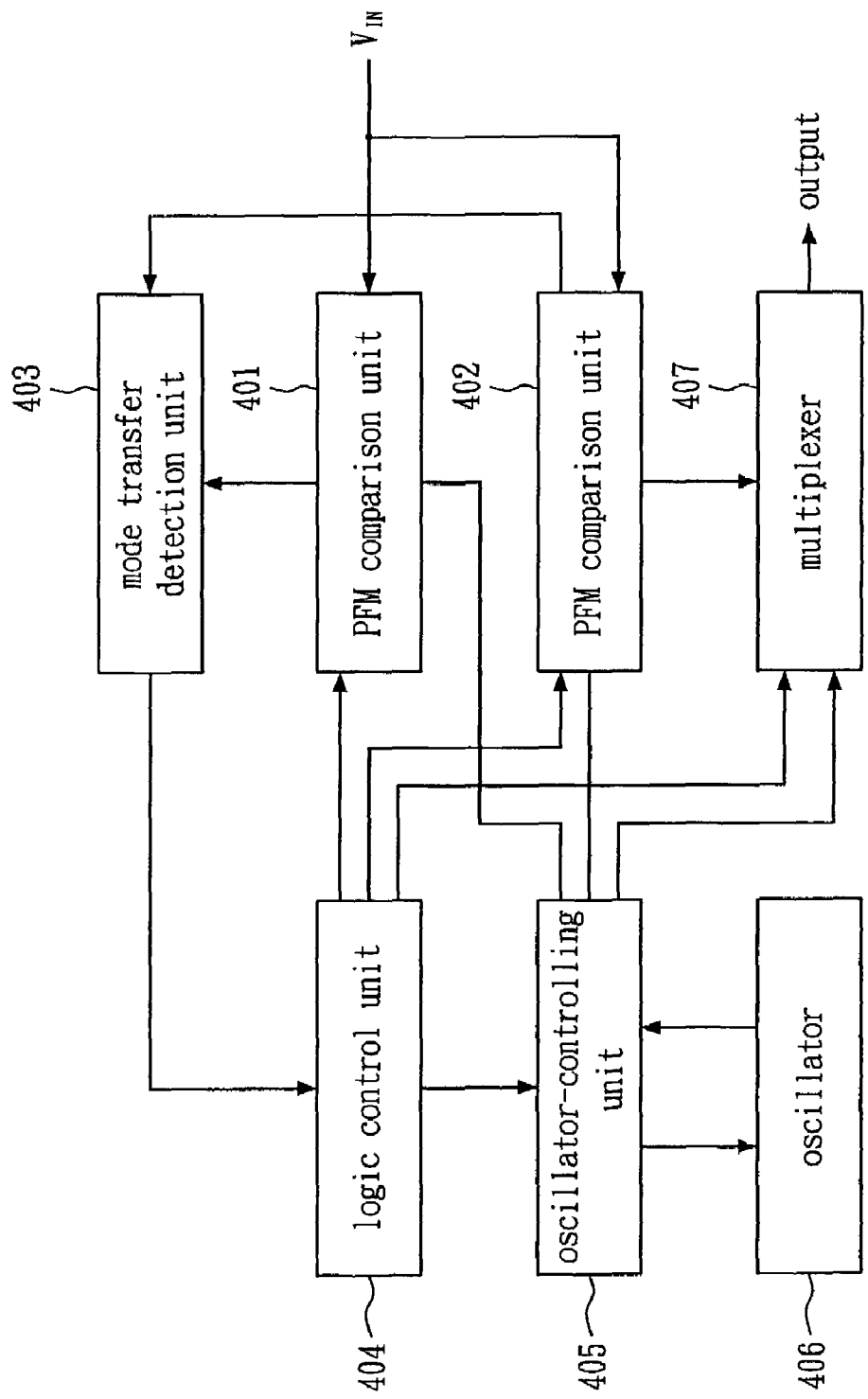
FIG. 4 shows a circuit for switching PFM and PWM according to an embodiment of the present invention.

FIG. 4 shows a circuit for switching PFM and PWM according to an embodiment of the present invention. After capturing dividing voltage $V_{IN}$ at the output end, a PFM comparison unit 401 and PWM comparison unit 402 will try to generate corresponding PFM and PWM signals. A mode transfer detection unit 403 is for use in detecting if the PFM signals have entered the maximal frequency. U.S. patent application Ser. No. 11/725,440, "circuit for detecting maximal frequency of pulse frequency modulation and method thereof" submitted by the inventors of the present invention discloses a circuit and method for detecting whether the PFM signals have entered the maximal frequency. The present invention incorporates U.S. Ser. No. 11/725,440 for reference. An oscillator 406 is for use in generating triangular wave signals, while an oscillator control unit 405 generates PFM square wave signals according to the triangular wave signals. When the mode transfer detection unit 403 determines that the PFM signals have entered the maximal frequency, a logic control unit 404 sets up the initial pulse width of the PWM signals as the pulse width of the PFM signals, and outputs PWM signals to the gate of the power transistor 21 through a multiplexer 407.

Figure 5:
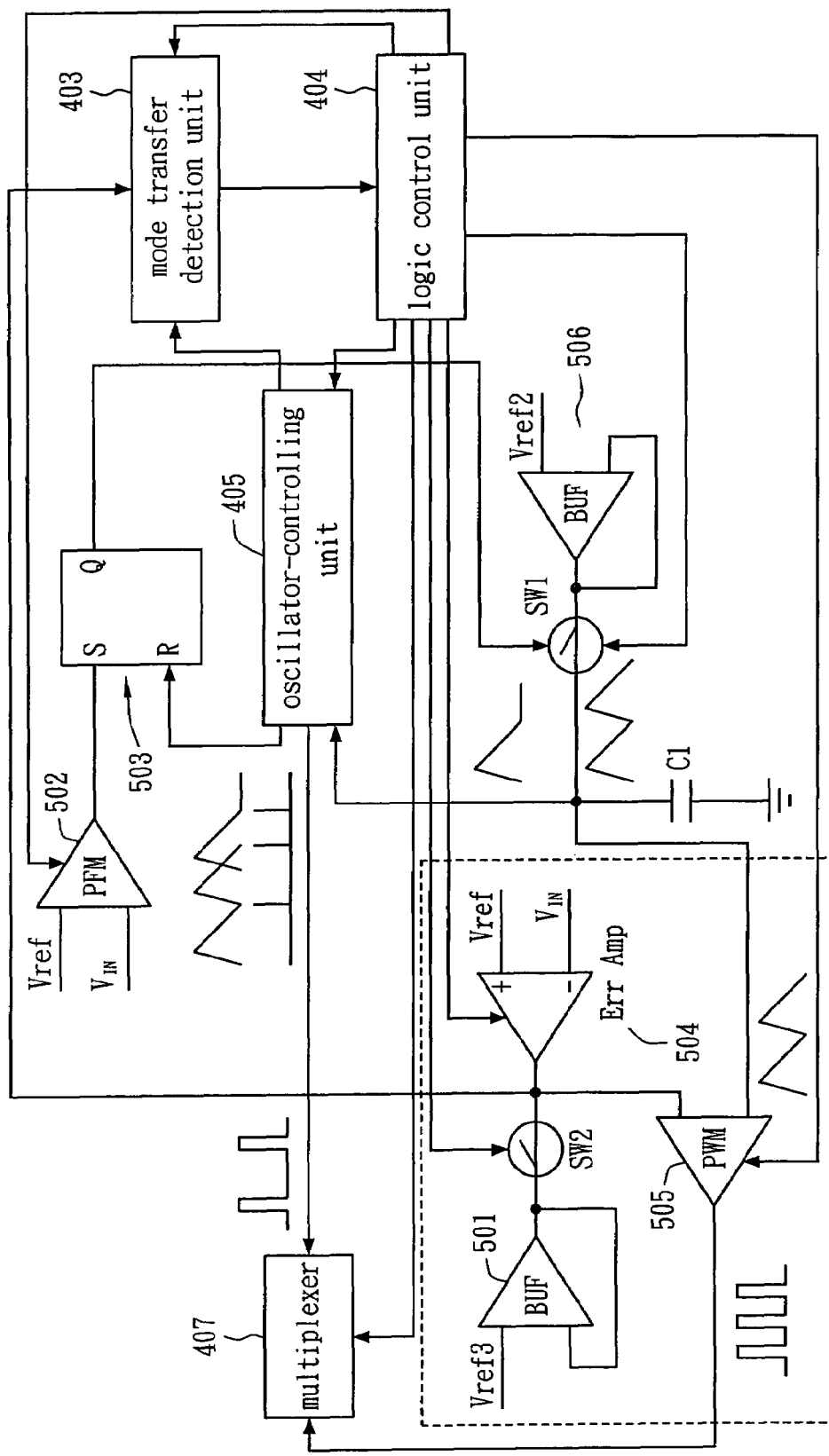
FIG. 5 is another circuit for switching PFM and PWM according to an embodiment of the present invention.

FIG. 5 is another circuit for switching PFM and PWM according to an embodiment of the present invention. When the captured voltage is greater than a first reference voltage, which means that the output loading is light, a PFM comparator 502 switches a switch SW1. The switch SW1 connects a unit gain amplifier 506 and a capacitor C1. Therefore, when the switch SW1 is turned on, triangular waves are outputted, which corresponds to On-time of the PFM signals. On the contrary, when the switch SW1 is turned off, no signals are outputted, which corresponds to OFF-time of the PFM signals. When the maximal frequency of the PFM signals appears, the switch SW1 stays in turn-on state and outputs continuous triangular waves. The PWM comparison unit 402 includes a unit gain amplifier 501, a switch SW2, an error amplifier 504 and a PWM comparator 505. The error amplifier 504 is for use in generating PWM signals. When the logic control unit 404 knows that the PFM signals have reached the maximal frequency through the mode transfer detection unit 403, it turns on the switch SW2 and the PWM comparator 505. Because one input end of the PWM comparator 505 comes from continuous triangular waves, the initial pulse width of the PWM signals is equal to the pulse width of the PFM signals. Finally, the logic control unit 404 enables the multiplexer 407 to output the PWM signals.

Figure 6:
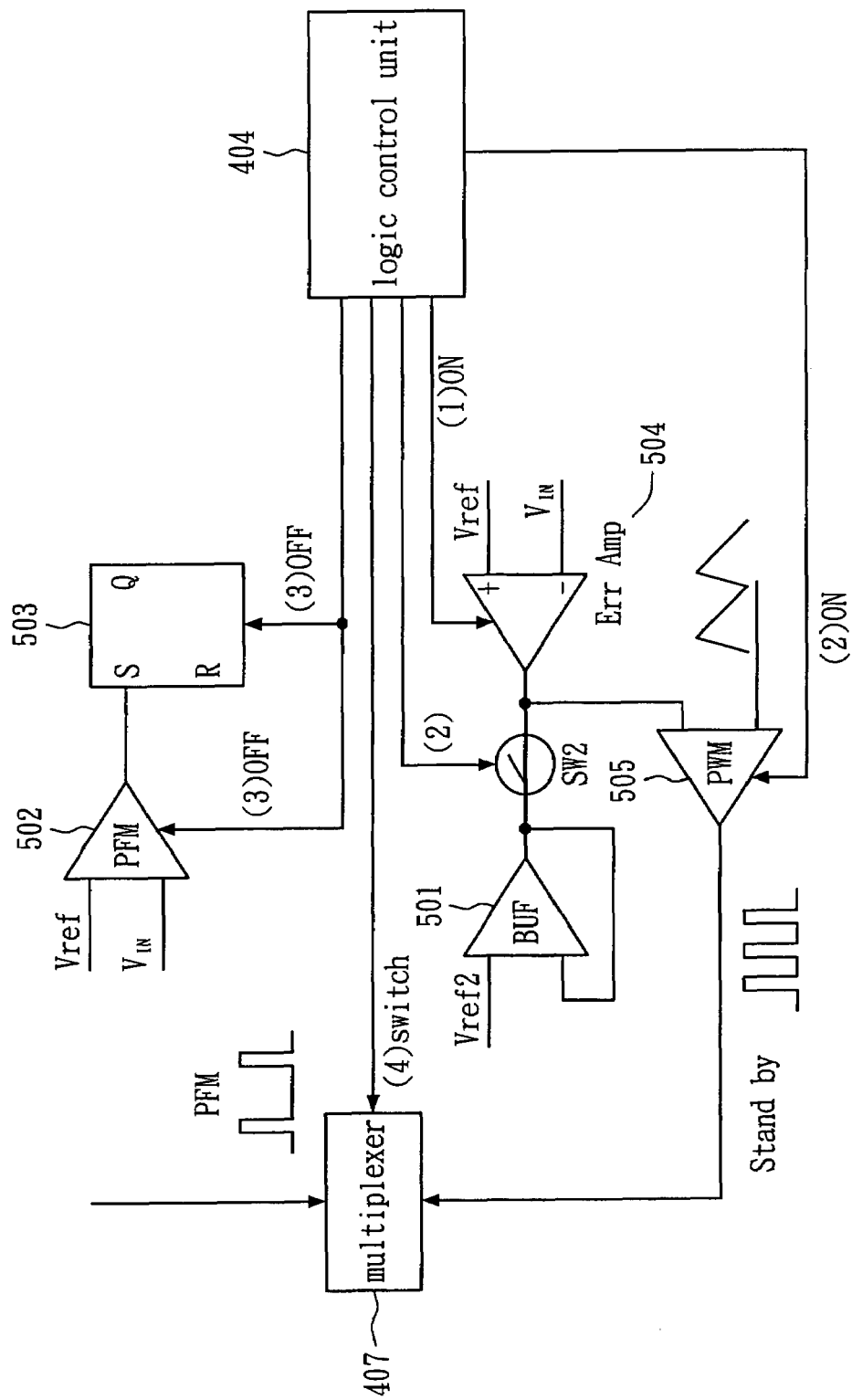
FIG. 6 shows a method for switching PFM and PWM according to an embodiment of the present invention.

FIG. 6 shows a method for switching PFM and PWM according to an embodiment of the present invention. In step 1, the logic control unit 404 enables the error amplifier 504 to generate PWM signals. In step 2, the logic control unit 404 enables switch SW2 and the PWM comparator 505 in order to generate an initial PWM signal having the same pulse width as the PFM signals. In step 3, the logic control unit 404 disables the PFM comparator 502 and latch 503. In step 4, the logic control unit 404 switches the multiplexer 407 to output the PWM signals.

Figure 7:
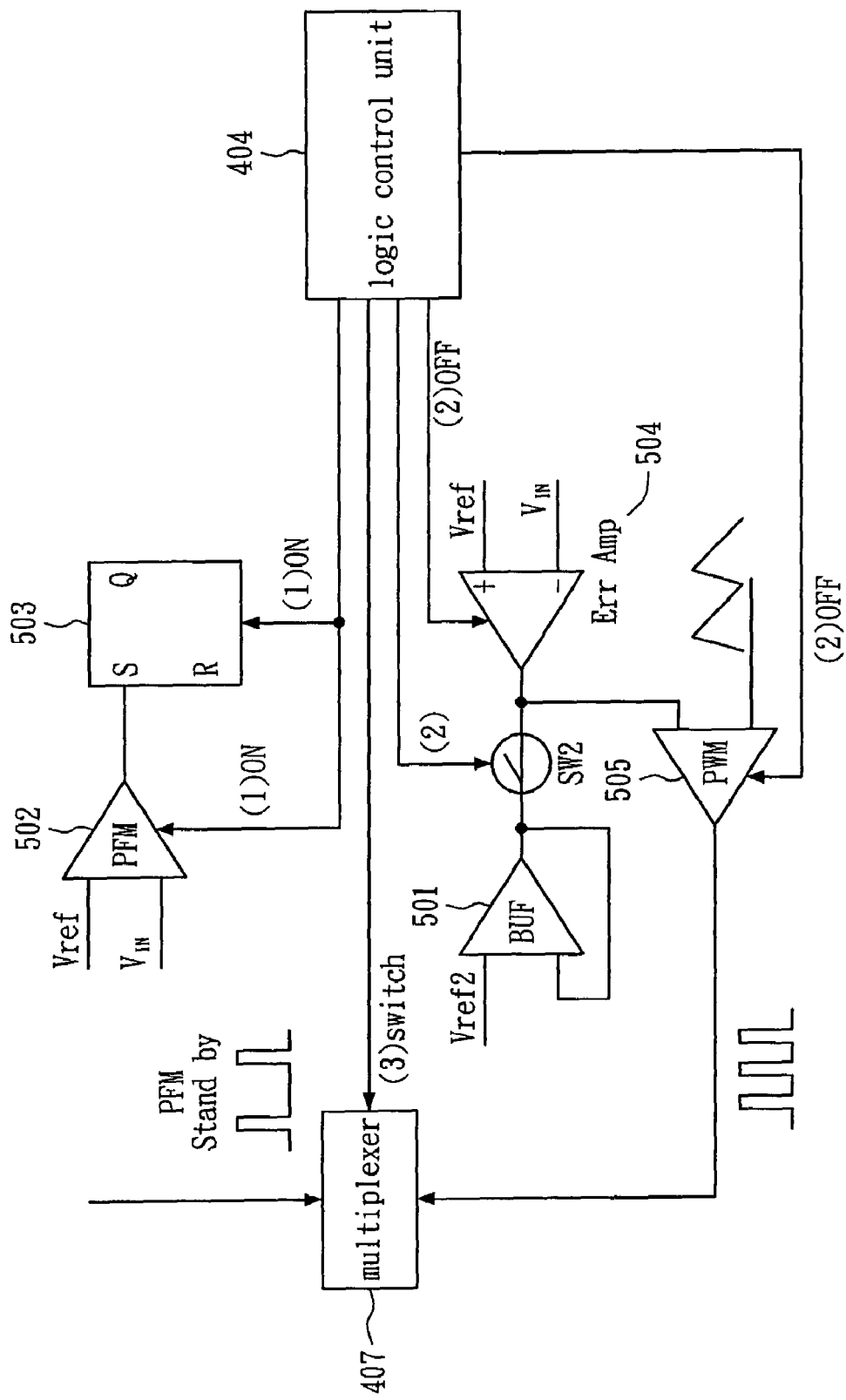
FIG. 7 shows another method for switching PFM and PWM according to an embodiment of the present invention.

FIG. 7 shows another method for switching PFM and PWM according to an embodiment of the present invention. In step 1, when the logic control unit 404 knows that the PFM signals leave their maximal frequency, the PFM comparator 502 and latch 503 are enabled. In step 2, the logic control unit 404 disables the error amplifier 504, the switch SW2 and the PWM comparator 505. In step 3, the logic control unit 404 switches the multiplexer 407 to output the PFM signals.

The above-described embodiments of the present invention are intended to be illustrative only. Numerous alternative embodiments may be devised by persons skilled in the art without departing from the scope of the following claims.

What is claimed is:

1. A circuit for switching pulse frequency modulation (PFM) and pulse width modulation (PWM) based on an output voltage of a power transistor, the circuit comprising:
   an oscillator for generating triangular waves;
   an oscillator-controlling unit connected to the oscillator for generating PFM signals;
   a PFM comparison unit connected to the oscillator-controlling unit;
   a mode transfer detection unit connected to the PFM comparison unit for detecting if the PFM signals have reached a maximal frequency;
   a PWM comparison unit configured to adjust the initial width of the PWM signals to be equal to the pulse width of the PFM signals when the maximal frequency occurs;
   a multiplexer for selecting either the PWM or PWM signals; and
   a logic-controlling unit configured to control the multiplexer according to the result of the mode transfer detection unit.

2. The circuit of claim 1, wherein the PWM comparison unit includes a unit gain amplifier and a switch, wherein the switch is turned on when the PFM signals reach the maximal frequency.

3. The circuit of claim 1, wherein the PFM comparison unit includes a PFM comparator and a latch, wherein the latch determines if it is necessary to enable the oscillator to generate triangular waves when the PFM signals have not reached the maximal frequency.

4. The circuit of claim 1, wherein the oscillator-controlling unit includes a unit gain amplifier, a switch and a capacitor, wherein the switch is always turned on when the PFM signals have reached the maximal frequency.

5. The circuit of claim 1, wherein the mode transfer detection unit is for use in detecting if the PFM signals have escaped from the maximal frequency.

6. The circuit of claim 3, wherein the PWM comparator is for use in comparing the output voltage and a first reference voltage in order to determine a start-up frequency of the oscillator.

7. The circuit of claim 1, wherein the PWM comparison unit includes a PWM comparator and an error amplifier, one end of the PWM comparator connects to the output of the error amplifier, and the other end of the PWM comparator connects to the output of the oscillator.

8. A method for switching PFM and PWM, comprising the steps of:

generating PFM signals based on an output voltage of a power transistor;

determining if the PFM signals have reached a maximal frequency;

adjusting the initial pulse width of the PWM signals to be equal to the pulse width of the PFM signals if the maximal frequency occurs; and switching the PWM signals as output signals.

9. The method of claim 8, further comprising the step of disabling PFM.

10. A method for switching PFM and PWM, comprising the steps of:

determining if the PFM signals have left maximal frequency based on an output voltage of a power transistor;

adjusting the pulse width of the PWM signals to be equal to the pulse width of the PFM signals; and switching the PFM signals as output signals.

11. The method of claim 10, further comprising the step of disabling PWM.

* * * * *